United States Patent [19]
Klatser

[11] Patent Number: 5,120,984
[45] Date of Patent: Jun. 9, 1992

[54] SAWTOOTH GENERATOR WITH TWO-STEP DISCHARGE

[75] Inventor: Paul Klatser, Almelo, Netherlands

[73] Assignee: U.S. Philips Corporation, New York, N.Y.

[21] Appl. No.: 749,366

[22] Filed: Aug. 22, 1991

[30] Foreign Application Priority Data

Aug. 23, 1990 [NL] Netherlands ............... 9001856

[51] Int. Cl.⁵ .................................... H03K 4/50
[52] U.S. Cl. .......................... 307/228; 307/260; 307/246; 328/181
[58] Field of Search ........... 307/228, 261, 246, 350, 307/260; 328/181, 183

[56] References Cited

U.S. PATENT DOCUMENTS 3,303,359  2/1967  Des Brisay, Jr. ............ 328/183
3,569,842  3/1968  Schroyer .................... 328/181

Primary Examiner—John S. Heyman
Assistant Examiner—Sinh N. Tran
Attorney, Agent, or Firm—Bernard Franzblau

[57] ABSTRACT

A sawtooth generator for an oscilloscope which provides an accurate DC voltage control after flyback of the sawtooth voltage. The sawtooth generator includes a balance circuit in the control loop and an error amplifier with symmetrical outputs. A current-mirrored copy of the integration current is supplied as the tail current for the balance circuit. The control loop is thus forced to control around a zero error signal.

12 Claims, 3 Drawing Sheets

SAWTOOTH GENERATOR WITH TWO-STEP DISCHARGE

BACKGROUND OF THE INVENTION

This invention relates to a sawtooth generator comprising a current source, capacitive means for integrating a current to be supplied by the current source, and an electronic switch coupled to the current source and to the capacitive means, which switch has a gate input for the supply of a gate signal for switching the sawtooth generator to a first operational state in which the sawtooth generator supplies a sawtooth-shaped signal at its output and to a second operational state in which the capacitive means are included in a control loop. The capacitive means is at least partly discharged by discharging means and the output is controlled to a DC voltage value. The control loop comprises a comparison means with a first input which is coupled to the output of the sawtooth generator and with a second input for the supply of a reference signal, which comparison means supplies a control signal for controlling the DC voltage value.

The invention also relates to an oscilloscope provided with such a sawtooth generator.

A sawtooth generator of the kind mentioned in the opening paragraph is used, inter alia, in a horizontal deflection circuit of an oscilloscope provided with a cathode ray tube as a display medium for showing the waveforms to be measured. The signal to be measured is in that case applied to a vertical deflection circuit and to a trigger circuit in a horizontal deflection circuit which starts the sawtooth generator periodically. The sawtooth generator supplies a signal for the horizontal deflection of a cathode ray in the cathode ray tube. The horizontal deflection system forms a so-called time base. Measuring instruments other than oscilloscopes, for example a counter, may also comprise such a time base.

Such a sawtooth generator is known from British Patent no. 1,516,200. In a first operational state of the sawtooth generator, a sawtooth voltage is formed at the output of this generator through integration of a current passed by a capacitor. In a second operational state, the capacitor is discharged and the voltage at the output of the sawtooth generator is controlled so as to achieve a constant value, for example 0 V, by means of a control loop. Although the control loop described in the cited British Patent no. 1,516,200 gives improved results compared with a non-controlled output voltage in the second operational state as regards transitional effects, the sawtooth generator disclosed nevertheless leaves something to be desired. The control loop, which is switched on via an electronic switch, comprises a diode whose anode is connected to an output of a comparison means and whose cathode is connected to the capacitor. Upon switching over from the second control state to the first operational state in which a sawtooth voltage is generated across the capacitor, the anode voltage will suddenly drop, as a result of which the diode will be blocked. The diffusion charge present in the diode will give rise to an undesirable transitional effect between the second and the first operational state. Overshoot to below the controlled DC voltage value will then take place before integration is carried out in a correct manner. Furthermore, different integration capacitors will be switched off when such a sawtooth generator is used in an oscilloscope with various ranges, such as decades. This gives rise to differences in control behavior of the control loop in the second operational state. A comparatively small capacitance value means a comparatively high loop amplification with the risk of an unstable control characteristic, whereas a comparatively high capacitance value means a comparatively low loop amplification so that the control loop could become too slow.

SUMMARY OF THE INVENTION

The invention has for its object, inter alia, to provide a sawtooth generator of the kind mentioned in the opening paragraph which exhibits an improved behaviour at the transition from the second to the first operational state and which has a good control characteristic for a comparatively great capacitance variation combined with a stable control.

A sawtooth generator according to the invention is characterized in that the control loop comprises a balance circuit and the comparison means is provided with symmetrical outputs for supplying a first and a second input of the balance circuit, and in that the balance circuit is coupled to the current source by means of a current mirror and is further coupled to the electronic switch. After switching from the first to the second operational state, it is achieved after at least a partial discharge of the capacitive means that the control loop controls around a working point at which the control signal is substantially zero. A small residual error in the control loop is simply eliminated without a high loop amplification being necessary, so that a stable control results also for comparatively small capacitance values of the capacitive means. An operational amplifier may be used as the comparison means. In that case it is important for a stable control that a first bend in the frequency diagram of the operational amplifier lies at a comparatively high frequency, and it is important for an accurate control that the operational amplifier has a low offset.

An embodiment of a sawtooth generator according to the invention is characterized in that the balance circuit is a differential amplifier circuit and in that the current source is of double construction, a first branch of the current source supplying the current to the capacitive means, and a second branch of the current source supplying a current to a 1:2 current mirror, of which a mirrored current forms a tail current of the differential amplifier circuit, while an output of the differential amplifier circuit is coupled to the electronic switch. A tail current which is twice the integration current in the first operational state is imposed on the differential amplifier circuit. This tail current divides itself substantially symmetrically over two output branches of the differential amplifier circuit. The differential amplifier circuit, therefore, is substantially in balance.

A further embodiment of a sawtooth generator according to the invention is characterized in that the electronic switch is formed by a first and a second transistor, whose respective emitters are connected to one another and to the output of the differential amplifier circuit, whose collectors are connected to a connection terminal for a first supply voltage and to the capacitive means, respectively, and whose bases are connected to the gate input and to a connection terminal for a second supply voltage, respectively. The base of the second transistor is connected to, for example, ground potential so that crosstalk between the gate input and the capacitive means is avoided, so that a good transitional behaviour between the operational states is obtained.

A further embodiment of a sawtooth generator according to the invention is characterized in that the discharging means are coupled to the emitters and are driven by the gate signal and by a comparator coupled to the output of the sawtooth generator, which comparator comprises a reference input for receiving a reference signal having a value higher than the reference value of the comparison means. The discharging means may be formed by a current source which supplies a substantially higher current than the charging current so that the capacitive means are quickly discharged. When the capacitive means have been almost completely discharged, the discharging means are switched off and further discharging takes place through the control loop.

BRIEF DESCRIPTION OF THE DRAWING

The invention will be explained in more detail with reference to the accompanying drawing in which.

DESCRIPTION OF THE PREFERRED EMBODIMENTS

Figure 1A:
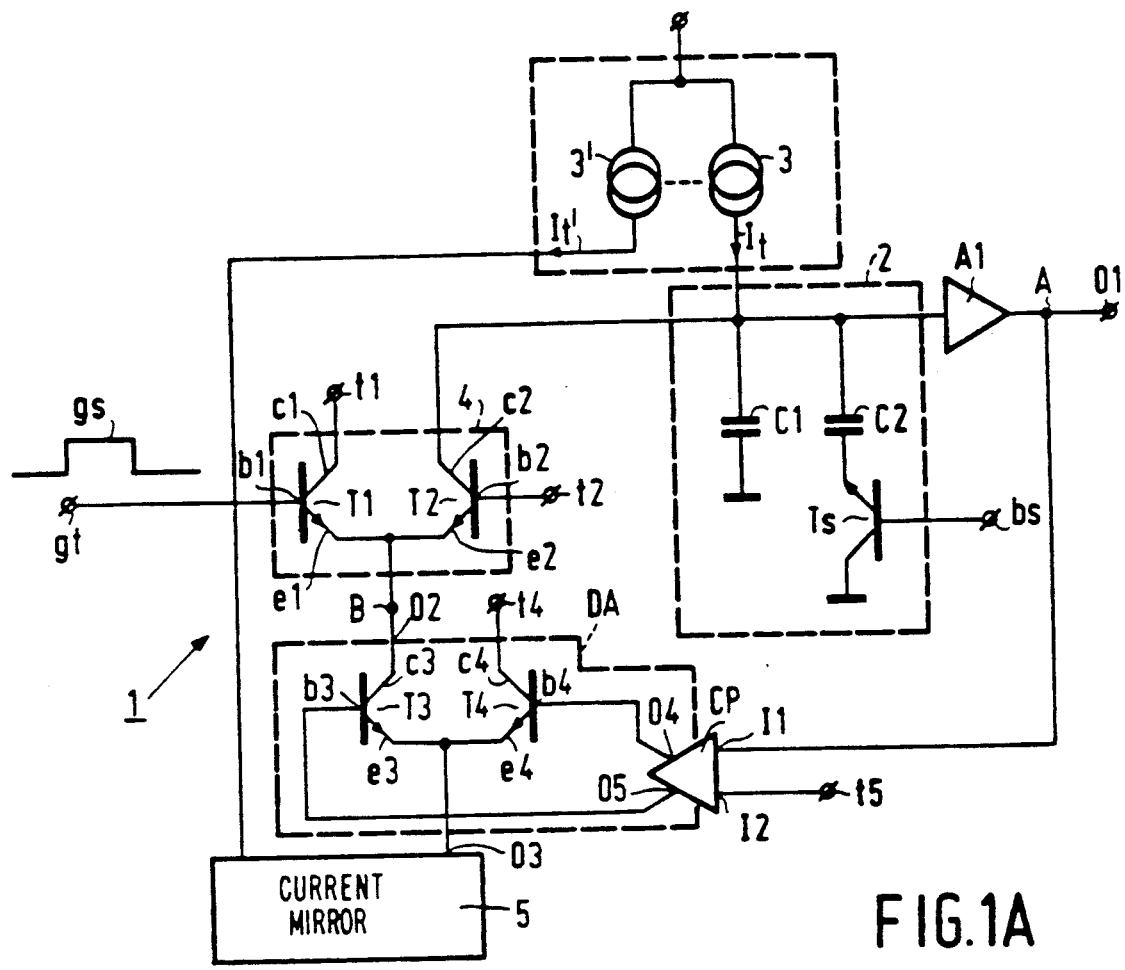
FIG. 1A shows a sawtooth generator according to the invention.

FIG. 1A shows a sawtooth generator 1 according to the invention. The sawtooth generator 1 comprises capacitive means 2 for integrating a current $I_t$ to be supplied by a current source 3. The capacitive means 2 comprise a number of capacitors C1, C2 connected in parallel. The capacitor C2 may be connected in parallel to the capacitor C1 in that a transistor Ts is rendered conductive by a signal at a drive input bs thereof. The drive signal input bs may be a digital signal. An integrated current $I_t$ appears at an output O1 of the sawtooth generator 1 after buffering by a buffer amplifier A1. The sawtooth generator 1 further comprises an electronic switch which is connected to the capacitive means 2 and is formed by a first transistor T1 and a second transistor T2. The emitters e1 and e2 of the transistors T1 and T2 are interconnected and are also connected to an output O2 of a differential amplifier circuit DA. The collector c1 of the transistor T1 is connected to a first supply voltage connection terminal t1. The collector c2 of the transistor T2 is connected to the capacitive means 2. The base b1 of the transistor T1 is connected to a gate input gt, and the base b2 of the transistor T2 is connected to a second supply voltage connection terminal t2. The differential amplifier circuit DA is formed by transistors T3 and T4. The collector c3 of the transistor T3 is connected to the output O2, and the collector c4 of the transistor T4 is connected to a supply voltage connection terminal T4. The emitters e3 and e4 are interconnected and connected to an output O3 of a 1:2 current mirror 5. The bases b3 and b4 of the transistors T3 and T4 are connected to symmetrical outputs O5 and O4, respectively, of a comparison means CP. The comparison means CP is connected by its input I1 to the output O1 of the sawtooth generator 1, and by its input I2 to a connection terminal t5 for the supply of a reference value. Furthermore, the current source 3 is of double construction with current source 3' supplying a current $I_t'$. The current $I_t'$, which is at least substantially equal to the current $I_t$, is supplied to the current mirror 5. The current mirror 5 may be constructed in known manner as described, for example, on pp. 71-74 of the handbook "The Art of Electronics", Horowitz and Hill, Cambridge UP, 1982, ISBN 0 521 29837 7. The sawtooth generator 1 may be set for a first and for a second operational state through the supply of a gate signal gs to the gate input gt. In a first operational state in which the gate signal gs is high, the transistor T1 is conducting and the transistor T2 is non-conducting, $I_t$ is integrated and a sawtooth-shaped signal appears at the output O1. In a second operational state, in which the gate signal gs is low, the transistor T1 is non-conducting and the transistor T2 is conducting, a control loop comprising the buffer amplifier A1, the comparison means CP, the differential amplifier circuit DA, and the transistor T2 is closed. A current of $2.I_t'$ is supplied to the differential amplifier circuit DA as a tail current via the 1:2 current mirror 5. When the capacitor C1 has been almost completely discharged by discharging means yet to be described, the working point of the control loop is situated substantially around a zero error voltage, because on the one hand the collector c3 of the transistor T3 passes substantially the current $I_t$ and on the other hand the collector c4 of the transistor T4 also is forced to pass substantially the current $I_t$ via the current mirror 5. A small error voltage value in the control loop is simply eliminated. No high loop amplification is necessary, which benefits the stability of the circuit.

Figure 1B:
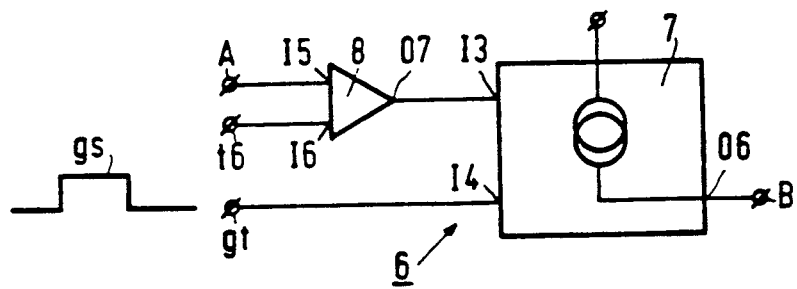
FIG. 1B shows discharging means for use in a sawtooth generator according to the invention.

FIG. 1B shows discharging means 6 for use in a sawtooth generator 1 according to the invention, comprising a controllable current source 7 with drive inputs I3 and I4. A, B and gt indicate how the discharging means 6 are connected in the sawtooth genrator 1 shown in FIG. 1A. The point A is connected to the output O1 of the sawtooth generator 1, and an output O6 of the current source 7 is connected to the emitters e1 and e2 of the transistors T1 and T2. The discharging means 6 further comprises a comparator 8 which is connected by an input I5 to the output O1 and by an input I6 to a connection terminal t6 for the supply of a reference signal. An output O7 of the comparator 8 is connected to the input I3 of the current source 7. The reference signal at the connection terminal t6 has a slightly higher value than the reference signal at the connection terminal t5 of the control loop of the sawtooth generator, for example, 0.3 V higher.

Figure 2:
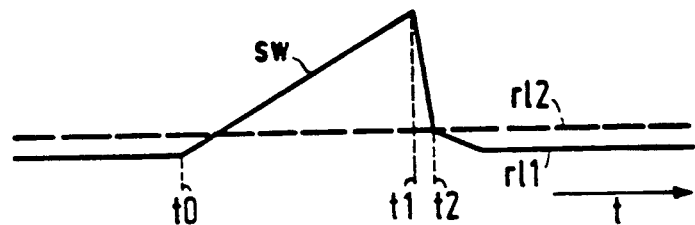
FIG. 2 shows a sawtooth signal as a function of time t.

FIG. 2 shows a sawtooth signal sw as a function of time t. In the first operational state of the sawtooth generator 1, integration takes place and the signal sw shows a rising slope, whereas in the second operational state a quick discharge takes place after which a reference level r11 is controlled at the connection terminal t5. The broken line indicates the reference level r12 at the connection terminal t6.

The operation of the sawtooth generator 1 according to the invention shown in FIGS. 1A and 1B is as follows. As was described above, the transistor T2 is blocked by the signal gs at t=t0, and integration of the current $I_t$ is started by the capacitive means 2. At t=t1, the signal gs switches off the transistor T1 and switches on the transistor T2, while simultaneously the current source 7, which carries a much greater current than the current source 3, is activated. Up to the moment t=t2, therefore, the capacitive means 2 are quickly discharged, which is indicated by a steep falling slope in FIG. 2. When the output signal at the output O1 has reached the reference level r12, the current source 7 is deactivated and the control loop takes over the further discharge and control to the reference level r11, for example, ground level. The discharge then takes place more slowly than with the discharging means 6. As described, the control loop is already substantially in balance because of the configuration according to the invention.

Figure 3:
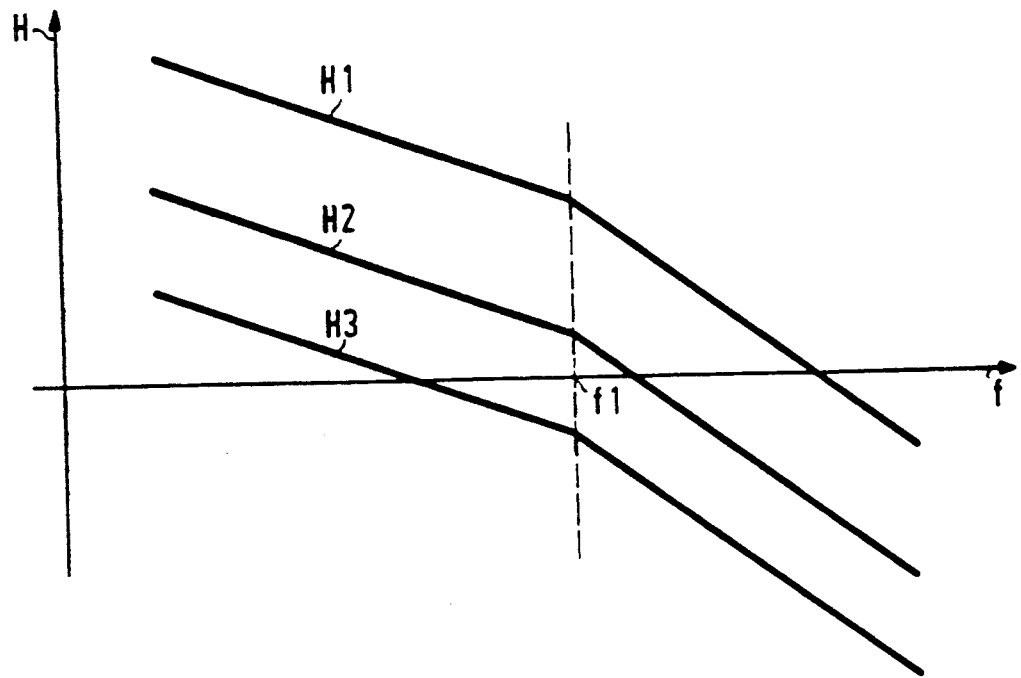
FIG. 3 shows a Bode diagram of a transfer function of a control loop of a sawtooth generator.

FIG. 3 shows a Bode diagram of a transfer function of a control loop of a sawtooth generator for various capacitance values of the capacitive means, i.e. the logarithm of the modulus H of the transfer function is plotted asymptotically against the frequency f. Up to the frequency f=f1, the control loop behaves as a pure integrator, i.e. the modulus falls with a slope of 6 dB per octave, and after the frequency f=f1 a first time constant of the comparison means CP starts playing a part and the modulus H falls with a slope of 12 dB per octave. The modulus is greater for a comparatively small capacitance value than for a comparatively great capacitance value, indicated with three modulus graphs H1, H2 and H3, respectively. If a sawtooth generator according to the invention is to operate satisfactorily, i.e. a good control characteristic is combined with a good stability of the control loop with a comparatively wide spread in capacitance values, it is necessary for the first bend in the Bode diagram H resulting from the comparison means CP to lie at a comparatively high frequency, for example, above 200 MHz. The amplification of the comparison means may be, for example, 20 dB, i.e. a comparatively low amplification.

Figure 4:
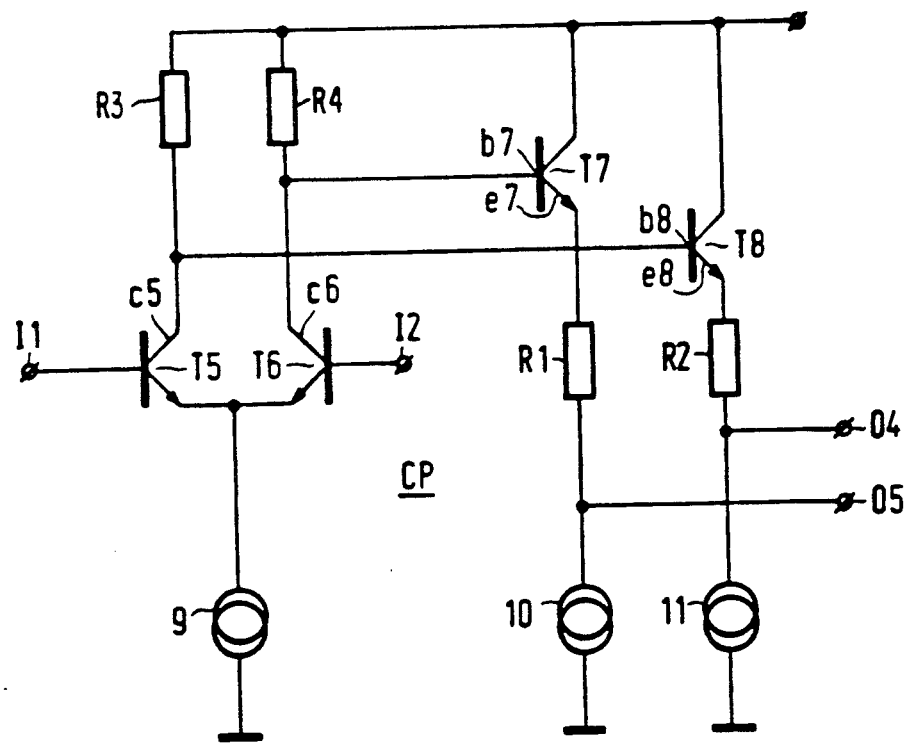
FIG. 4 shows in more detail a comparison means with symmetrical outputs for use in a sawtooth generator according to the invention.

FIG. 4 shows in more detail a comparison means CP with symmetrical outputs for use in a sawtooth generator 1 according to the invention. The inputs I1 and I2 and the outputs O4 and O5 correspond to the inputs and outputs described with reference to FIG. 1A. The comparison means CP comprises transistor pair T5, T6 with a current source 9 for tail current, and transistors T7 and T8 which are connected by their respective drive inputs b7 and b8 to collectors c6 and c5 of the transistors T6 and T5. Emitters e7 and e8 are coupled to current sources 10 and 11 and to the outputs O5 and O4. The transistor pair T5, T6 provides the amplification for the comparison means CP, and the transistors T7 and T8 serve as a buffer, ensuring a voltage level shift. The level shift is determined by a choice of resistance values for resistors R1 and R2, and through a choice of values for the current sources 10 and 11. The offset of the comparison means CP should be low. The collectors c5 and c6 are connected to the supply voltage terminal via the resistors R3 and R4, respectively.

Figure 5:
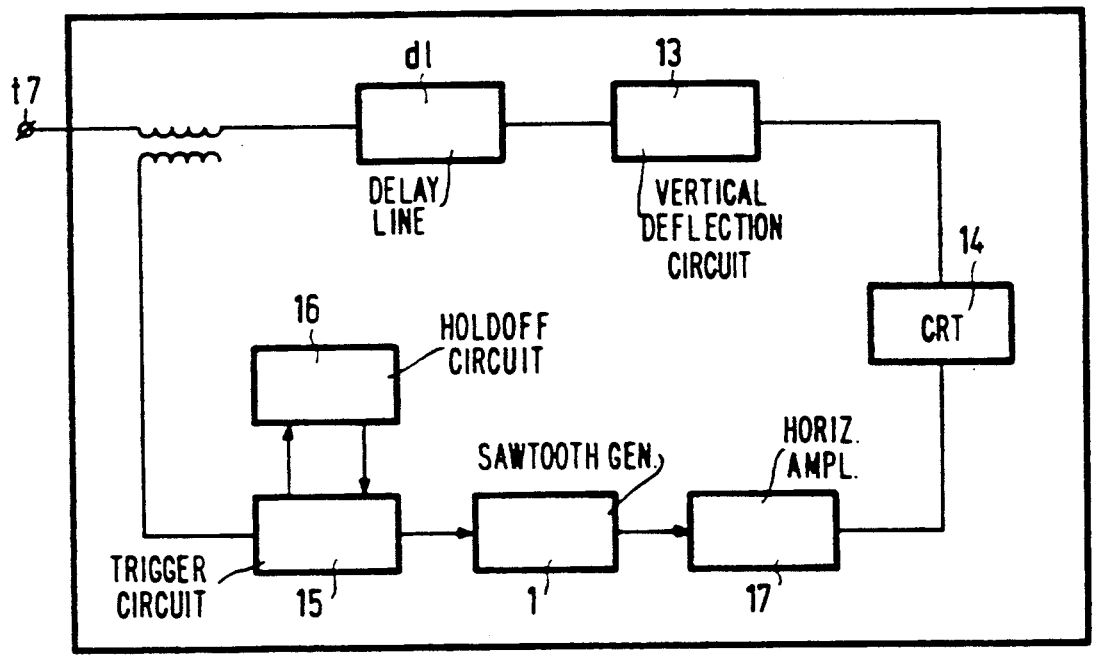
FIG. 5 shows an oscilloscope provided with a sawtooth generator according to the invention.

FIG. 5 shows an oscilloscope 12 provided with a sawtooth generator 1 according to the invention. The oscilloscope 12 comprises an input terminal t7 for receiving a signal to be measured. The signal to be measured is supplied to a vertical deflection circuit with amplifier 13 via a delay line dl. The vertical deflection circuit 13 controls vertical deflection plates of a cathode ray tube 14 which acts as a display medium for showing the periodic signal to be measured. Furthermore, the signal to be measured is branched off from the input terminal t7 as a signal for a trigger circuit 15, which supplies in known manner trigger pulses to the sawtooth generator 1 and to a so-called holdoff circuit 16. The output signal of the sawtooth generator 1 is supplied to horizontal deflection plates of the cathode ray tube 14 via a horizontal amplifier 17. For a more detailed description of the operation of an oscilloscope, reference is made to the handbook "Oscilloscopes", R. van Erk, McGraw-Hill 1978, ISBN 0-07-067050-1.

I claim:

1. A sawtooth generator comprising: a current source, capacitive means coupled to an output of the sawtooth generator, said capacitive means integrating a current to be supplied by the current source, an electronic switch connected to the current source and to the capacitive means, wherein said switch has a gate input for the supply of a gate signal for switching the sawtooth generator to a first operational state in which the sawtooth generator supplies a sawtooth-shaped signal at its output and to a second operational state in which the capacitive means are included in a control loop, the capacitive means being at least partly discharged by discharging means and the output being controlled to a DC voltage value, the control loop comprising a comparison means having a first input coupled to the output of the sawtooth generator and with a second input for receiving a reference signal, which comparison means supplies a control signal for controlling the DC voltage value, characterized in that the control loop further comprises a balance circuit and the comparison means includes symmetrical outputs for supplying a first and a second input of the balance circuit, and in that the balance circuit is coupled to the current source by means of a current mirror and is further coupled to the electronic switch.

2. A sawtooth generator as claimed in claim 1, wherein the balance circuit comprises a differential amplifier circuit, the current source comprises, a first branch supplying the current to the capacitive means and a second branch supplying a current to said current mirror, of which a mirrored current forms a tail current of the differential amplifier circuit, and an output of the differential amplifier circuit is coupled to the electronic switch.

3. A sawtooth generator as claimed in claim 2, wherein the electronic switch comprises a first and a second transistor, whose respective emitters are connected to one another and to the output of the differential amplifier circuit, whose collectors are connected to a connection terminal for a first supply voltage and to the capacitive means, respectively, and whose bases are connected to the gate input and to a connection terminal for a second supply voltage, respectively.

4. A sawtooth generator as claimed in claim 3, wherein the discharging means are coupled to the emitters of the first and second transistors and are driven by the gate signal, wherein said discharging means include a comparator coupled to the output of the sawtooth generator, said comparator comprises a reference input for receiving a second reference signal having a value higher than the reference value of the comparison means.

5. A sawtooth generator as claimed in claim 1, wherein the capacitive means comprise a number of selectablk capacitors connected in parallel.

6. An oscilloscope provided with a sawtooth generator as claimed in claim 1, wherein the sawtooth generator is included in a horizontal deflection circuit of the oscilloscope.

7. A sawtooth generator as claimed in claim 1, wherein the electronic switch comprises a first and a second transistor, whose respective emitters are connected to one another and to an output of the balance circuit, whose collectors are connected to a connection terminal for a first supply voltage and to the capacitive means, respectively, and whose bases are connected to the gate input and to a connection terminal for a second supply voltage, respectively.

8. A sawtooth generator as claimed in claim 7, wherein the discharging means are coupled to the emitters of the first and second transistors and are driven by the gate signal, wherein said discharging means include a comparator coupled to the output of the sawtooth generator, said comparator comprises a reference input for receiving a second reference signal having a value higher than the reference value of the comparison means.

9. A sawtooth generator as claimed in claim 2, wherein the capacitive means comprise a number of selectable capacitors connected in parallel.

10. A sawtooth generator as claimed in claim 3, wherein the capacitive means comprise a number of selectable capacitors connected in parallel.

11. A sawtooth generator as claimed in claim 1, wherein said discharging means are coupled to said electronic switch and to said sawtooth generator output and said discharging means include means for controlling the discharge of the capacitive means during said second operational state, said discharge being at a first high rate followed by a discharge at a second slower rate.

12. A sawtooth generator as claimed in claim 1, wherein said current mirror comprises an input connected to the current source and an output connected to said balance circuit to supply a current to the balance circuit which is twice a current at the input of the current mirror.

* * * * *